(12) United States Patent
Kuzmenka et al.

(10) Patent No.: US 7,915,915 B1
(45) Date of Patent: Mar. 29, 2011

(54) CIRCUIT SYSTEM FOR DATA TRANSMISSION

(75) Inventors: Maksim Kuzmenka, Munich (DE); Thorsten Hinderer, Unterhaching (DE)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/772,582

(22) Filed: May 3, 2010

(51) Int. Cl.
*H03K 19/003* (2006.01)
(52) U.S. Cl. .............................. 326/33; 326/83; 327/530
(58) Field of Classification Search .................... 326/26, 326/27, 31–34, 83; 327/503, 538
See application file for complete search history.

(56) References Cited

U.S. PATENT DOCUMENTS

| | | | | |
|---|---|---|---|---|
| 6,340,939 B1 * | 1/2002 | Dedic | ............................ | 341/136 |
| 6,803,809 B2 * | 10/2004 | Saitoh | ........................... | 327/541 |
| 6,882,191 B2 * | 4/2005 | Kwok | ........................... | 327/122 |
| 7,161,401 B2 * | 1/2007 | Li | ................................. | 327/157 |

* cited by examiner

*Primary Examiner* — Don P Le
(74) *Attorney, Agent, or Firm* — Morrison & Foerster LLP

(57) ABSTRACT

A differential stage circuit is disclosed, which includes a differential circuit, a current source coupled to supply, when activated, an operating current to the differential circuit, and a control circuit coupled to control activation and deactivation of the current source. The differential stage circuit further includes a compensation circuit configured to supply a compensation pulse to the current source when the current source is activated.

20 Claims, 10 Drawing Sheets

CIRCUIT SYSTEM FOR DATA TRANSMISSION

BACKGROUND OF THE INVENTION

The present invention relates to a circuit system for transmitting data to a receiver, and wherein the receiver may be quickly enabled.

DESCRIPTION OF RELATED ART

Data transmission takes place, for example, in electronic systems, such as computers, between a memory controller device and a memory device. Such a memory device could be a dynamic random access memory (DRAM).

While standard DRAM interfaces are typically 64 bit wide, graphic systems use much wider interface widths such as 256 bit or even 512 bit to achieve the required bandwidth. If using that many receivers, the receiver's power consumption is a concern. Hence, it is desired to provide a fast enabling of the receivers which would allow to power down the receivers during even short idle states and thus decrease the average power consumption.

In order to provide a circuit system for data transmission, a differential or single ended data transmission could be used. However, differential receiving stages are more advantageous, since they decrease the sensitivity to signal and supply noise for high frequency data transmission. Further, in case of differential signaling, there is no need for any additional reference signals: complementary signals may act like references for each other. In case of single ended signaling, an additional reference voltage V_REF has to be delivered to the receiver or may be generated on-chip.

As an example, a typical data receiver structure is shown in FIG. 1. The differential input pair is comprised of n-channel MOS transistors N1 and N2 receiving the data DAT_IN_T and the corresponding complementary data DAT_IN_C, respectively. The n-channel MOS transistors N4 and N5 operates as a current mirror to act as a tail current source, and capacitor C1 ensures a stable gate bias voltage for transistor N5. The bias current I_BIAS may be delivered from an external circuitry (not shown). N-channel MOS transistor N3 provides the enable functionality by receiving the enabling signal RCV_EN corresponding to the original enabling signal EN_N (after having passed the inverter I1).

A disadvantage of this known configuration is that a good common mode rejection and output signal symmetry can only be achieved with high (ideally infinite) differential impedance of the tail current source. However, in a realistic circuit, a parasitic capacitance is present at the tail node ("TAIL" in the Figs.). In this particular implementation as shown in FIG. 1, the enabling transistor N3 adds significant additional parasitic capacitance ("C parasitic") to the tail node TAIL which drastically reduces the impedance of the tail node. In other words, a relatively high tail current I_TAIL may require a quite large transistor size of N3, resulting in a large parasitic capacitance so that a charge sharing effect occurs.

Further, when transistor N3 is enabled, it quickly pulls the drain of transistor N3 from supply potential to the operation point voltage. This transition may result in an overshoot-like behavior over the current with a 20-30% larger tail current for a transitional time period as shown in FIG. 3a. In the first graph, the differential data input signals DAT_IN_T and DAT_IN_C waveforms are shown in a particular time frame. In this time frame, the waveform of the enable signal RCV_EN is shown in the second graph, with the enable signal being activated shortly before the first data input is applied. In the third graph, the tail current I_TAIL features the discussed overshoot-like behavior for a particular duration of time, resulting in the distorted data output DAT_OUT_T and DAT_OUT_C as shown respectively in the fourth and fifth graphs of FIG. 3a. This means that the receiver characteristic is different for the duration of this overshoot, limiting the ability to reliably receive fast signals for this transitional time period.

Furthermore, transient charge sharing between drain and gate of transistor N5 may also increase the current overshoot: when the signal EN_N is pulled low, extra charge is injected into capacitor C1, thereby increasing the gate potential on transistor N5. This effect may be reduced by a large capacitor C1, but in practice area constraints limit the capacitance of C1 to a few picofarads (pF).

One known alternative for the FIG. 1 configuration is shown in FIG. 2, improving the differential input stage's performance: the enable transistor N6 is connected to the source network of current sourcing transistor N4. In this case, the enable transistor could be sized as large as needed for the low voltage drop, and the parasitic capacitance does not anymore affect the output signal quality. In doing so, much higher tail node impedance compared to the circuit in FIG. 1 may be achieved.

However, the configuration of the circuit as shown in FIG. 2 containing the capacitance C1 to obtain a stable gate current, leads to a slower enable as shown in FIG. 3b, when the signal RCV_EN is pulled high, the source potential of transistor N4 is rapidly pulled towards ground, and the charge sharing between gate-source capacitance of transistor N4 and capacitor C1 reduces the effective gate-source voltage of transistor N4 and thereby the tail current. This results in a slow current settling behavior (see third graph in FIG. 3b), thereby leading to a different receiver characteristic for the duration of this transition, so that the ability to reliably receive signals is again limited for this transitional time period. Similar as already discussed above, a large capacitance of C1 would avoid these effects, but in practice, such a capacitor would be too large on planar IC ("integrated circuit") technology.

SUMMARY OF THE INVENTION

The present invention relates to a circuit system providing a compensation pulse to the current source of a differential input receiver stage. The compensation pulse is generated in response to an enable signal controlling the activation of the receiver's tail current source.

In a first aspect of the present invention, a circuit system for data transmission comprises a differential stage for receiving data, a tail current source configured to supply a bias current to the differential stage, an enabling element coupled to the tail current source to control the tail current to the differential stage, and a circuit providing means configured to generate a compensation pulse to the tail current source in response to the receipt of an enable signal by the enabling element.

According to a second aspect of the present invention, there is provided a circuit system for transmitting and receiving data, which comprises a first and a second transistor coupled to a common node and functioning as a differential stage for receiving data, a capacitor coupled to a tail current source comprising a third transistor and configured to supply a bias current to the differential stage, the third and a fourth transistor coupled in series between the common node and the capacitor, and a circuit providing means configured to generate a charge compensation pulse to the tail current source and coupled in parallel or in series to the capacitor.

According to a third aspect of the present invention, a method for transmitting and receiving data, comprises (a) providing a circuit system comprising a first and a second transistor functioning as a differential stage, a third transistor functioning as a tail current source for the differential stage, and a fourth transistor functioning as an enabling element for the current source; (b) providing an enable signal to the fourth transistor to control the functionality of the third transistor; and (c) generating a charge compensation pulse to the third transistor in response to the activation of the third transistor.

Thus, the differential stage may comprise a first and a second transistor coupled by a common node, and may provide higher immunity against input and supply noise compared to a single ended stage, especially, if data transmission occurs at high frequencies (above about 1 GHz) and with low signal swing as in the present case.

The tail current source for supplying the differential stage may, for example, be realized by a (symmetrical) current mirror comprising a first and a second transistor coupled by a common node via their gates. Further, the tail current source may be coupled to an enabling element controlling the operation to the differential stage, for example, by activating the transistor(s) of the current mirror.

The enabling element may be realized by a transistor which may be rendered conductive or non-conductive, depending on an enable signal controlling the functionality of the enabling transistor.

The enable signal may be a control signal for switching on the circuit system in order to allow receipt of any data. For example, the enable signal may provide an "enable" function of the circuit system, so that the system is enabled to receive any data. In realistic circuits, the enable signal may pass a buffer/inverter and not the "original" enable signal, but a corresponding enable signal may be received by the enabling element and/or the compensation pulse provider. In the following, the expression "enable signal" may mean both, the original enable signal and the actually received ("realistic") enable signal.

In response to the enabling element being rendered conductive or non-conductive by the enable signal, charge sharing effects may occur as discussed above, so that the tail current source supplying the differential stage receiving the data does not provide the needed tail current for the differential stage within a particular time frame.

The compensation pulse provider in the circuit system according to the present invention compensates or substantially compensates the charge sharing effects by providing a charge compensation pulse to the tail current source of the differential stage as soon as the enable signal is received.

According to preferred embodiments of the present invention, the compensation pulse provider may be realized by a resistor divider or by a capacitance divider or by an additional current source.

In particular, the resistor divider and the current source may be coupled between a capacitor and the enabling element, wherein the capacitor is coupled to the tail current source. The capacitance divider may be arranged so that the first capacitor is coupled between the enabling element and the tail current source, and the second capacitor is arranged in parallel to the first capacitor, between the tail current source and a source of the enable signal.

In view of the fact that the tail current source for the differential stage may be a current mirror or even a transistor, and the enabling element may be a transistor, the circuit system of the present invention may be realized by providing a first and second transistor as a differential stage, a third transistor as a current source, a fourth transistor as an enabling element, and a compensation pulse provider for generating a compensation pulse to the tail current source for the differential stage.

If a resistor divider is used as a compensation pulse provider, the resistor divider may contain two resistors connected by a common node. The resistor divider ratio may be equal to the ratio of the capacitance of the current source and the capacitance of the capacitor between the resistor divider and the current source.

For example, the two resistors may have characteristic values of about 10Ω to about 100 kΩ, and the values are different for the two resistors, e.g. the first resistor may have a value of about 100Ω, whereas the second resistor may have a value of about 10Ω. In a preferred embodiment, the value of the first resistor is smaller than the value of the second resistor.

If a capacitance divider is used as a compensation pulse provider, the capacitor values may be between about 50 fF and about 20 pF. Preferably, the values are different for the two capacitors, e.g. the capacitor coupled between the current source and the enabling element may have a capacitance of about 50 fF, whereas the other capacitor may have a larger capacitance than the first one, for example, a capacitance of about 10 pF.

If a current source is used as a compensation pulse provider, the current source may be a current mirror. For example, the current mirror is a current operated device to control the supply current for the compensation pulse provider. In a preferred embodiment, the current mirror may comprise two transistors.

BRIEF DESCRIPTION OF THE DRAWINGS

The above and other aspects of the invention will be apparent from and exemplified with reference to the preferred embodiments taken in conjunction with the accompanied drawings, in which FIG. 1 schematically shows a known data receiver structure.

DETAILED DESCRIPTION OF PREFERRED EMBODIMENTS

Figure 4:
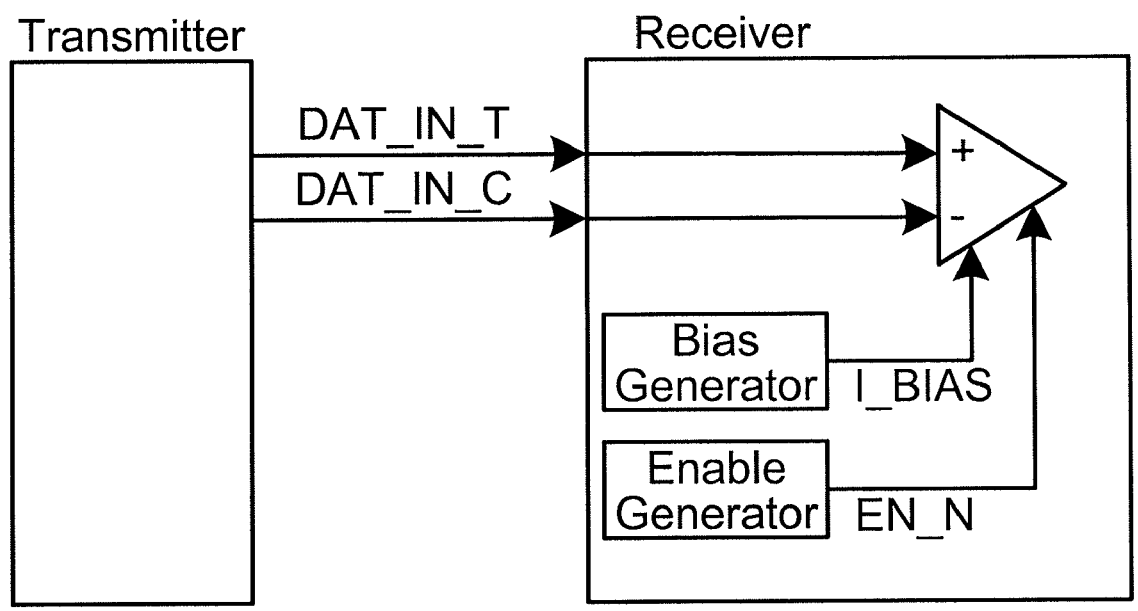
FIG. 4 schematically shows a system of a transmitter and a receiver receiving data from the transmitter according to a first embodiment of the present invention.

Referring now to FIG. 4, there is shown a system according to a first embodiment of the present invention, in which a transmitter and a receiver are formed respectively as, for example, an individual semiconductor chip, and coupled to data lines to each other. The transmitter transmits a data signal DAT_IN_T and, for example, a complementary data signal DAT_IN_C to the receiver through the data lines. The receiver comprises an input circuit (or buffer) receiving the true and complementary data signals DAT_IN_T and DAT_IN_C. The receiver further includes therein a bias generator for providing a bias current I_BIAS and an enable generator providing the enable signal EN_N, which are then supplied to an input circuit to control an operation thereof.

Figure 1:
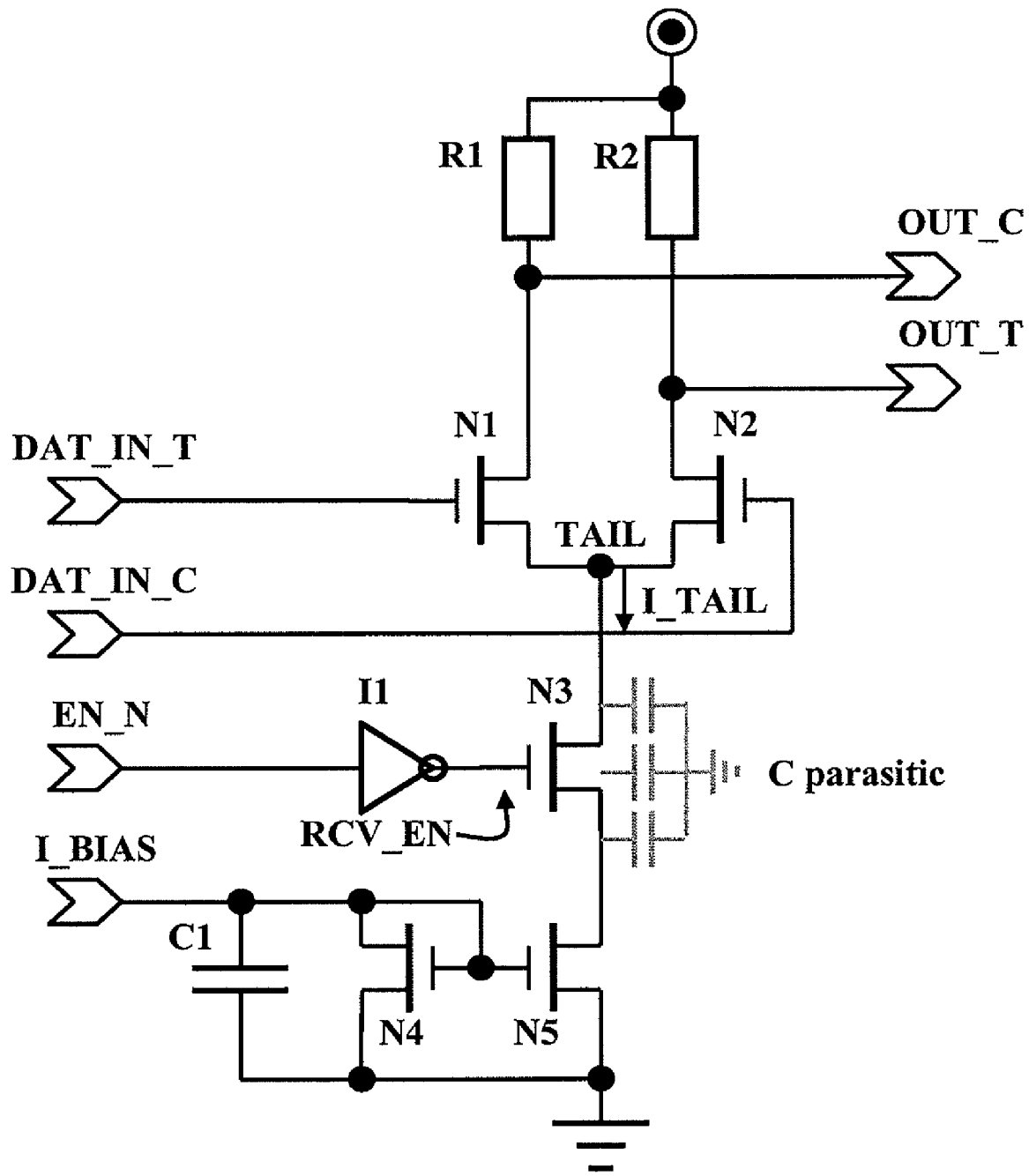
Figure 2:
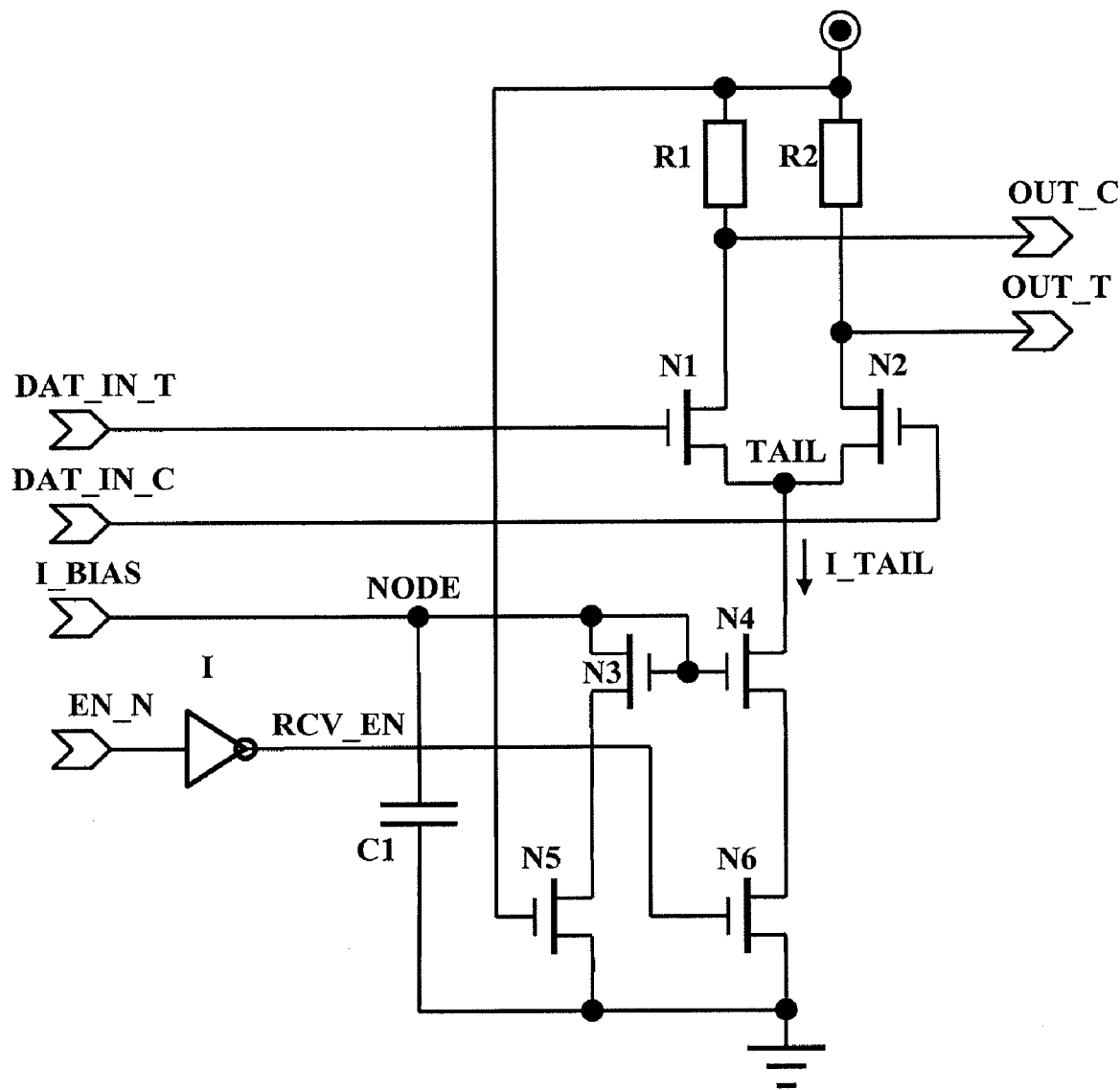
FIG. 2 schematically shows another known data receiver structure.
Figure 5:
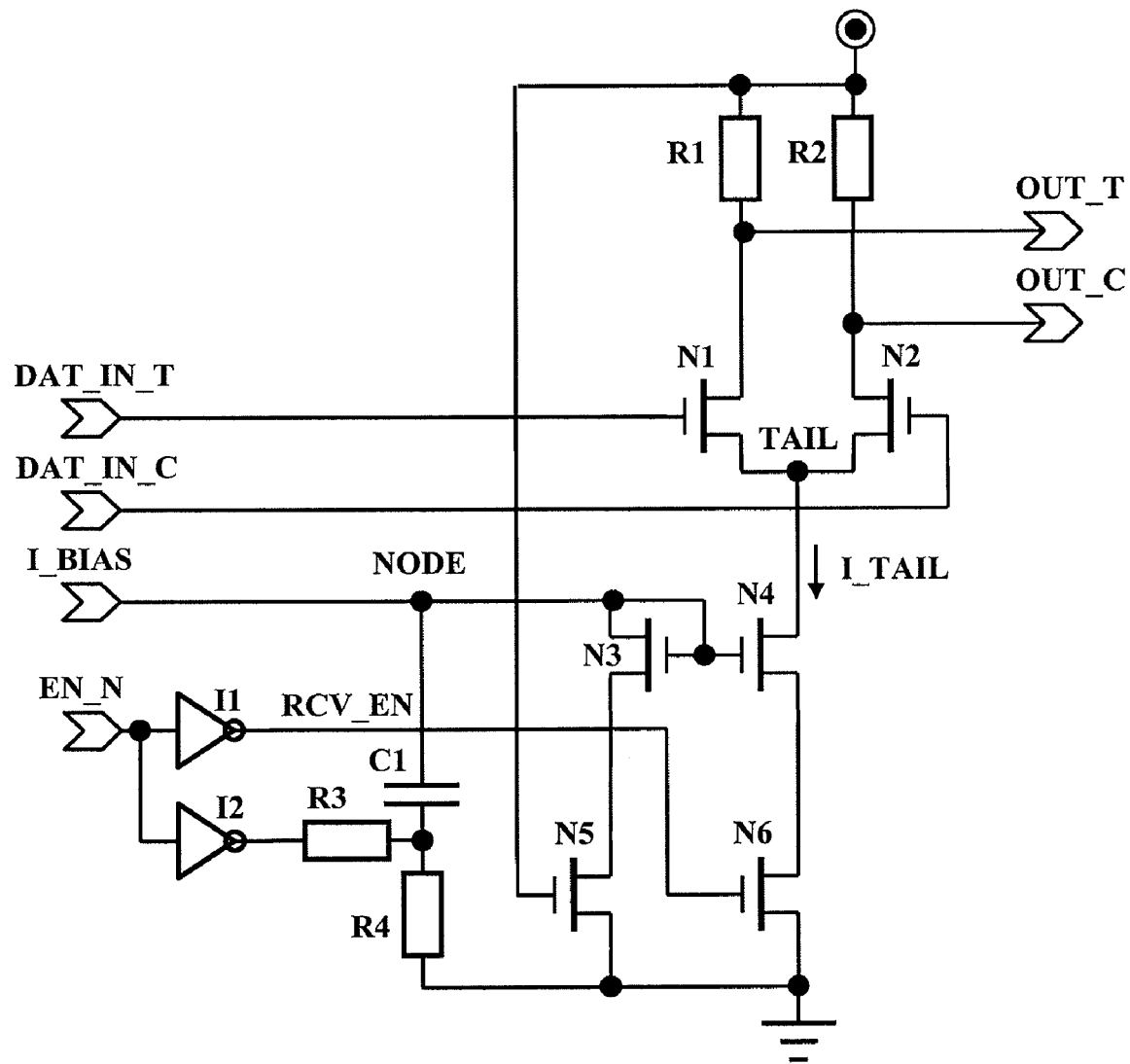
FIG. 5 schematically shows a receiver structure according to a second embodiment of the present invention.

The input circuit of FIG. 4 may be constituted as shown in FIG. 5 as a second embodiment of the present invention, in which similar components as discussed with reference to FIG. 2 above are indicated by the same reference numerals to omit further description thereof. In the circuit of FIG. 5, a resistor divider circuit including resistors R3 and R4 and an inverter I2 are further provided, and the capacitor C1 is connected between the node of the resistor divider (i.e., the connection node of the resistors R3 and R4) and the bias voltage supply node I_BIAS. The bias voltage I_BIAS is produced by the bias generator as shown in FIG. 4. The inverter I2 inverts the enable signal EN_N, which is produced by the enable generator as shown in FIG. 4, and supplies the inverted enable signal to the resistor divider. While, the inverters I1 and I2 are provided to indicate a realistic circuit implementation for electrically decoupling signal RCV_EN and the resistor divider R3 and R4 from the enable signal EN_N, one of the inverters I1 and I2 may be omitted to supply the inverted enable signal RCV_N in common to the resistor divider and the transistor N6. The resistor divider including resistors R3 and R4 creates a charge compensation pulse to the gate of transistor N4 in order to lower or even cancel the charge sharing effect resulting from the parasitic capacitances at the transistor N4. In a particular embodiment, it is possible to further reduce the parasitic capacitance of the parasitic capacitor at transistor N4 by providing a small gate length of the transistor N4. According to the shown embodiment, the resistance divider ratio R3/R4 is preferably equal to the ratio of the gate-source capacitance of transistor N4 and capacitance C1.

As an example, the capacitance of capacitor C1 is about 1 pF, and the values for resistors R3 and R4 are about 10 kΩ and about 100Ω, respectively. In order to keep the bias current source of I_BIAS stable within mV range, C1 may be designed to be very large. However, due to the fact that—in practice—such a capacitor would be too large on planar integrated circuits technology, a capacitance of not more than about 3.5 pF or at most up to about 5 pF may be used. As long as the resistance of resistor R4 is relatively small, this resistor does not negatively affect the quality of gate decoupling. In such a configuration, the current I_TAIL is stable within an extremely short period of time, maybe in about 1 ns, after the signal EN_N is pulled low.

Figure 6A:
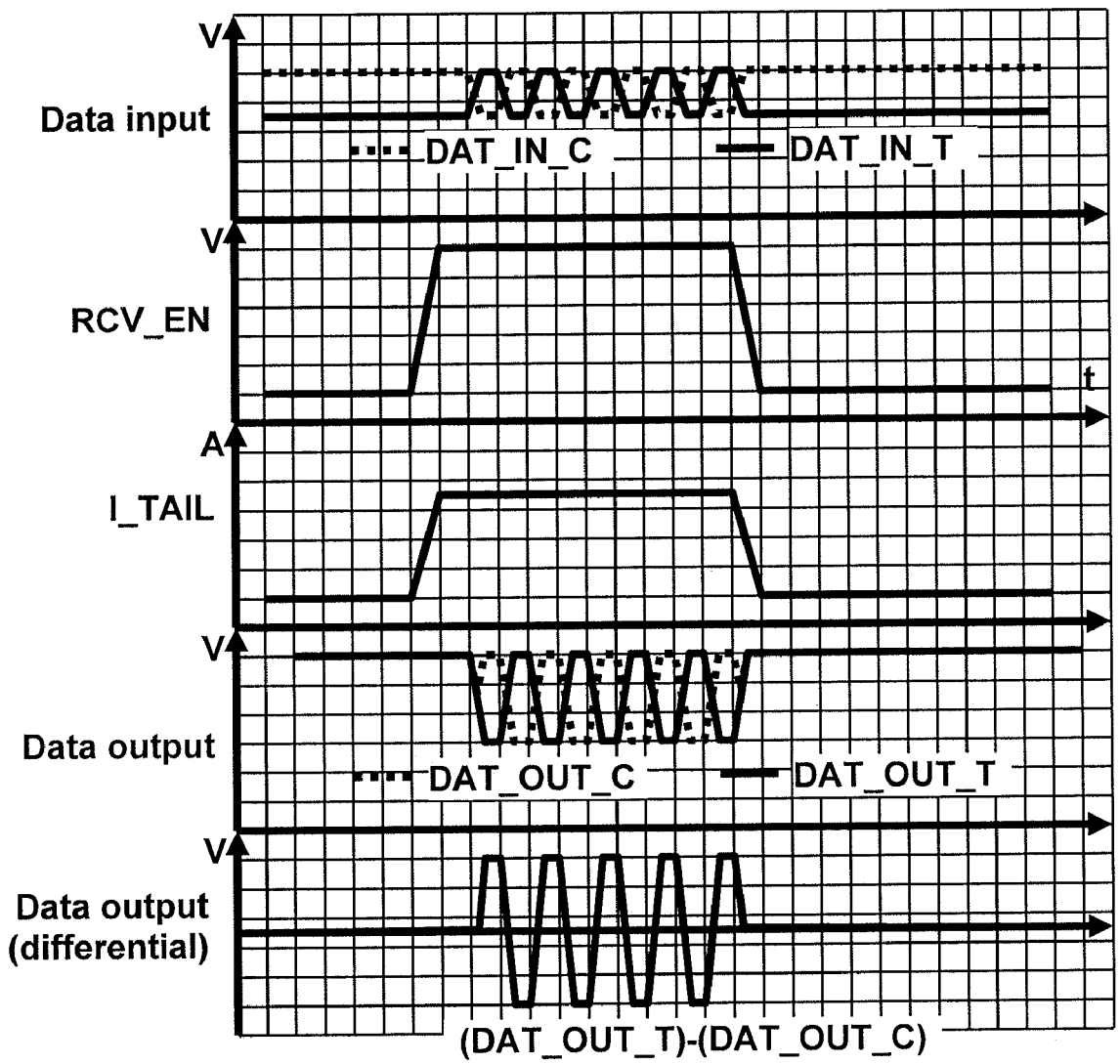
FIG. 6a schematically shows an ideal enable behavior of a differential receiver.

With the circuit construction described above, the input buffer circuit of FIG. 5 can operate with ideal signal waveforms as shown in FIG. 6a. In the first two graphs, the data input signals and the received enable signal are shown.

In an ideal data receiver circuit, the time dependent run of the curve of the tail current I_TAIL corresponds to the pull-up and pull-down of the enable signal EN_N. In this case, the input data DAT_IN_T and DAT_IN_C transmitted to the receiver during the time frame the receiver is enabled, can be non-distortedly received. Hence, the data output as shown in the last two graphs in FIG. 6a is reliably produced. Due to the uniform receiving conditions provided by a fast enabling of the receiver, even different symbols may easily be received over the whole time frame.

Figure 3A:
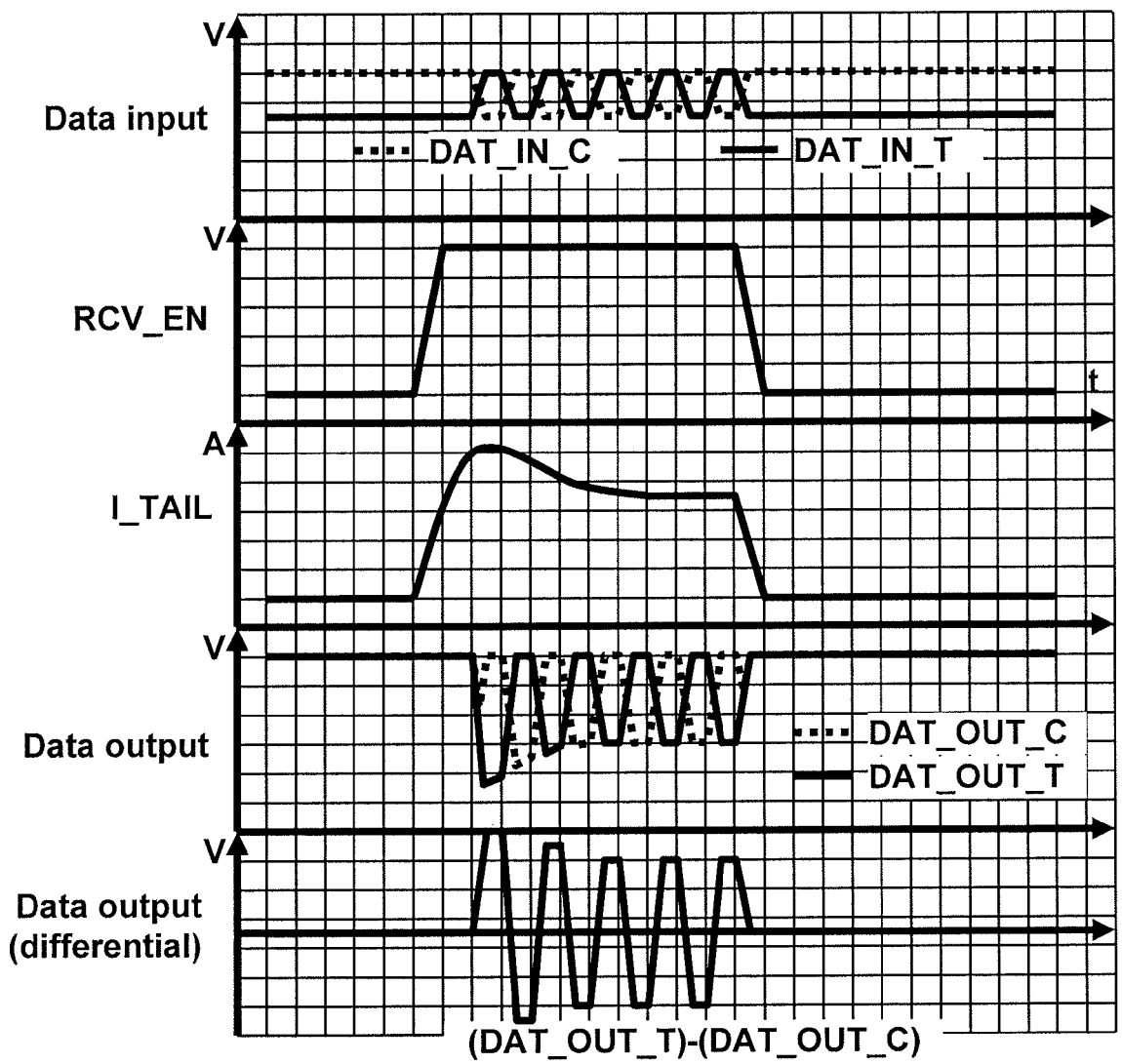
FIGS. 3a and 3b schematically show the enable behavior of the differential receiver configurations as shown in FIG. 1 and FIG. 2, respectively.
Figure 3B:
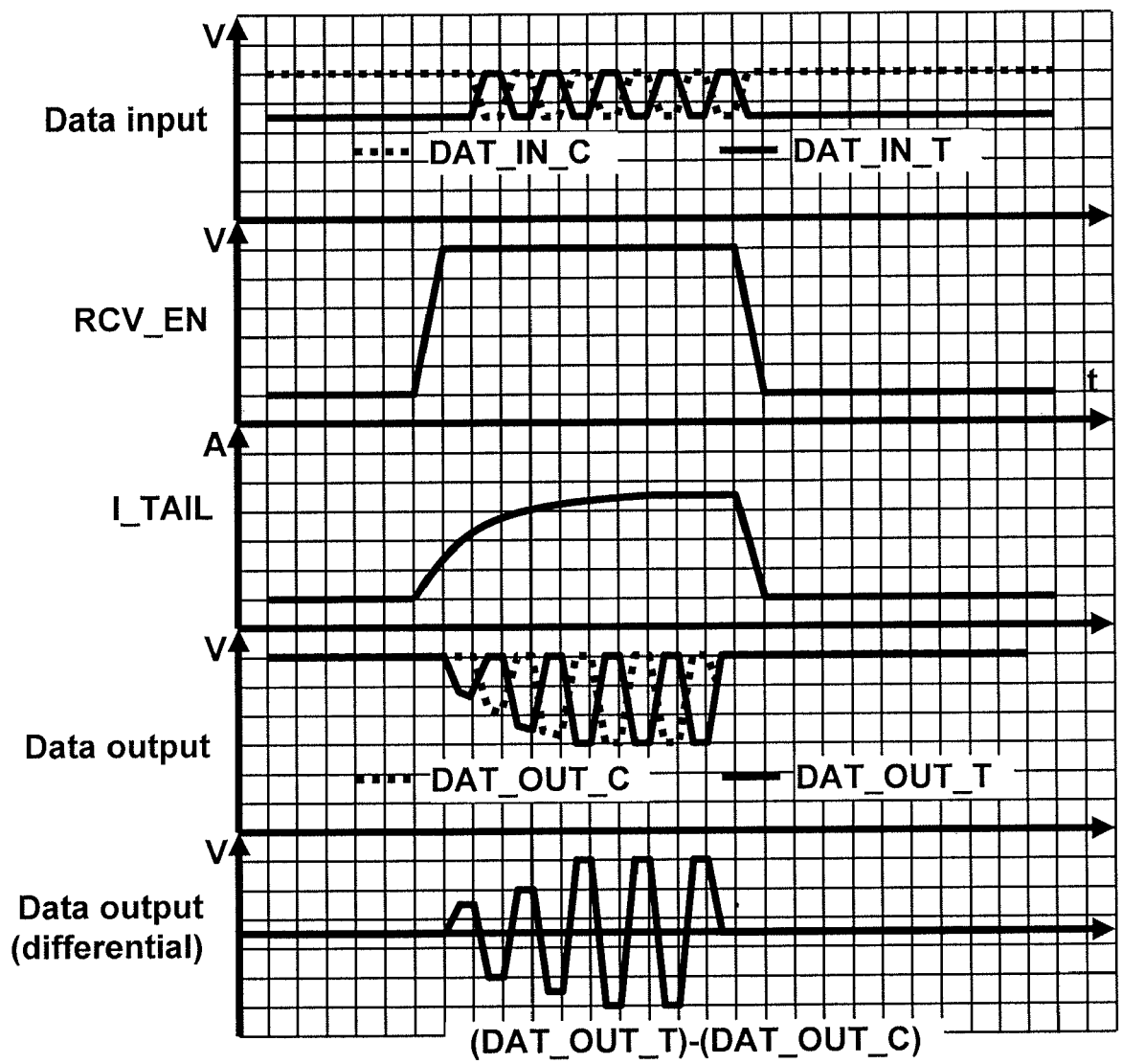
Figure 6B:
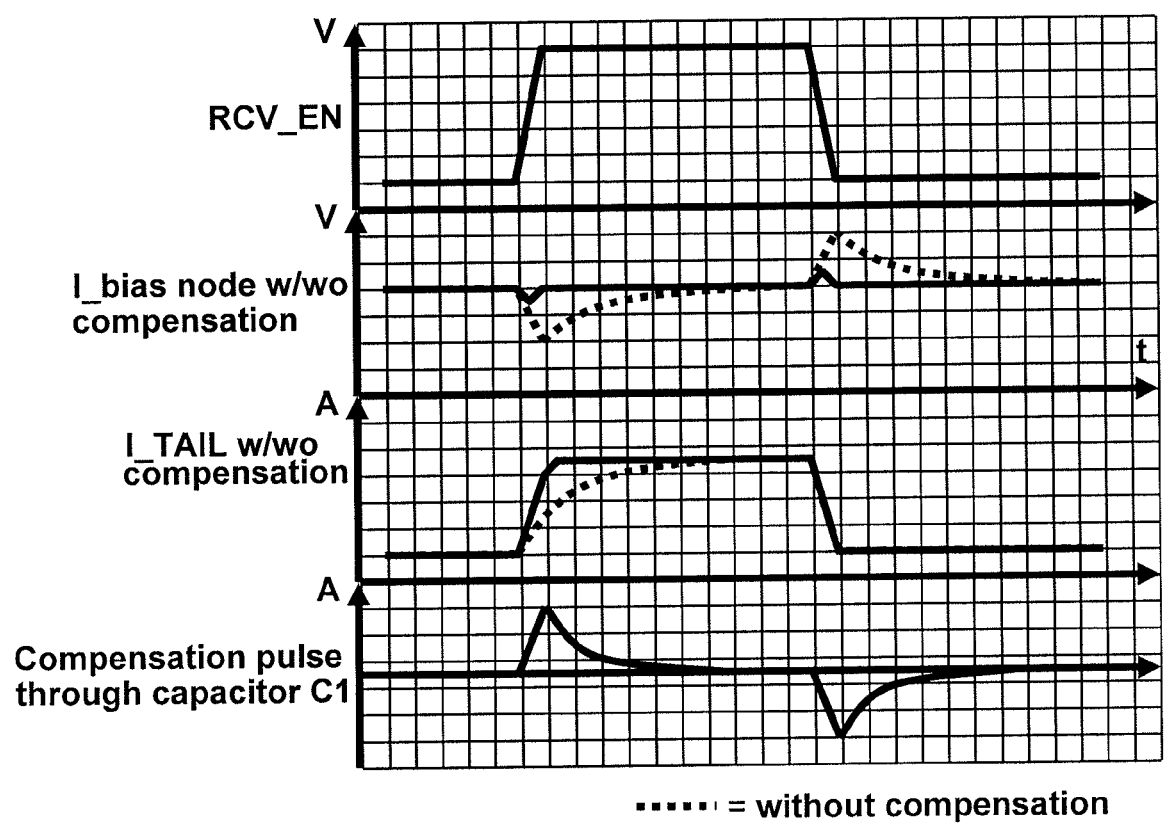
FIG. 6b schematically shows the effect of the compensation pulse according to the present inventions in order to improve the differential receiver's enable behavior.

Turning to FIG. 6b, there are shown internal voltage and current waveforms of the FIG. 5. In the first line of graphs, the enabling signal RCV_EN is shown, identical to the corresponding signal in FIG. 6a. Without compensation (dotted curve), the tail current I_TAIL is reduced in response to the enabling signal because of the charge sharing between the source-gate capacitance of transistor N4 and capacitor C1. The shown slow current settling behavior (see the dotted curve in the third graph) leads to the disadvantages discussed with reference to FIG. 2 and FIG. 3b, above. In other words, the bias current I_BIAS at the node (NODE) linking C1 and N4 should ideally be constant, even if an enabling signal is received, but—with the configuration as shown in FIG. 2—the charge sharing effect between C1 and N4 leads to the peaks as shown by the dotted curve in the second graph in FIG. 6b: if the enable signal is pulled up or down, the bias current at the node I_BIAS is pulled down and up and slowly settles in response to change of the enable signal RCV_EN.

According to the present invention, a compensation pulse is provided in order to equalize the non-uniform bias current I_BIAS. As shown in the fourth graph of FIG. 6b, a charge compensation pulse through C1 may be configured to interfere with the bias current I_BIAS at the node (NODE) so as to provide a resulting curve of an almost constant value for the bias current, i.e. the continuous curve of the second graph in FIG. 6b. In particular, the area between the dotted curve and the continuous curve for the bias current I_BIAS represents the charge to be compensated in order to obtain almost ideal conditions. If a compensation is provided, the almost constant bias current thus leads to a tail current I_TAIL (third graph in FIG. 6b) coming close to the ideal curve as shown in FIG. 6a (third graph). In doing so, signals may be received without distortion, since the conditions during the reception are uniform.

Figure 7:
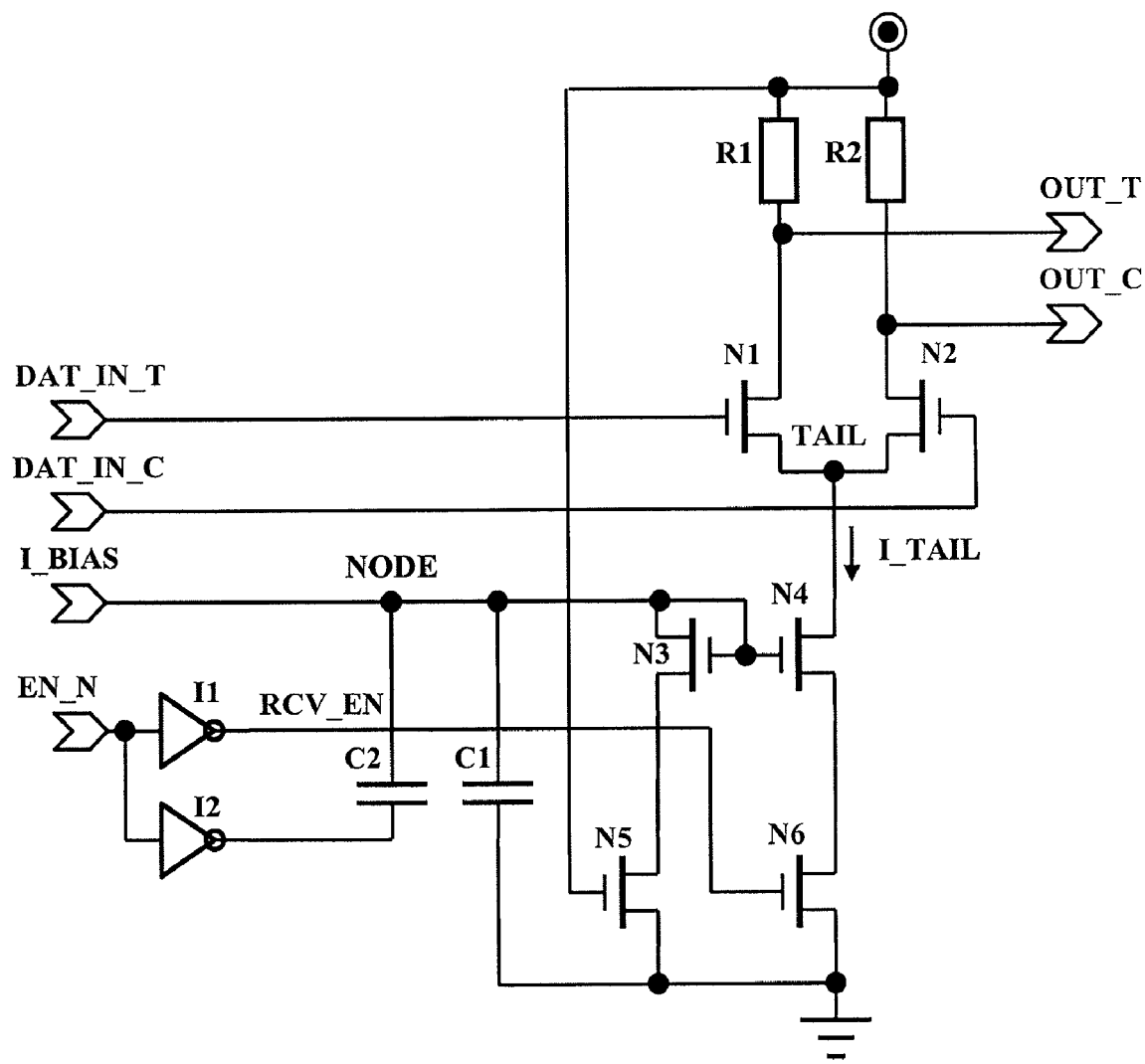
FIG. 7 schematically shows a receiver structure according to a third embodiment of the present invention.

FIG. 7 schematically shows a circuit according to a third embodiment of the present invention based on the same general concept as discussed above. The embodiment in FIG. 7 has similar components as the configuration shown in FIG. 5, but is different therefrom in that the resistor divider R3/R4 is replaced by using a capacitive divider. The capacitive divider is realized by adding a further capacitance C2 to the circuit, as shown in FIG. 7.

In an example, typical values for the capacitors C1 and C2 are about 1 pF and about 15 fF, respectively, so that an AC divider ratio close to about 100:1 may be achieved, thereby delivering a compensation of about 15 mV (with 1.5 V supply) to the gate of N4.

In particular, the capacitance divider C1/C2 provides a charge compensation pulse in this respect that the charge sharing between C1 and N4 is compensated in response to the change of the enable signal RCV_EN at C2. As discussed above with reference to FIG. 6b, the charge compensation pulse leads to an almost constant tail current I_TAIL, thus providing for uniform signal receiving conditions.

Figure 8:
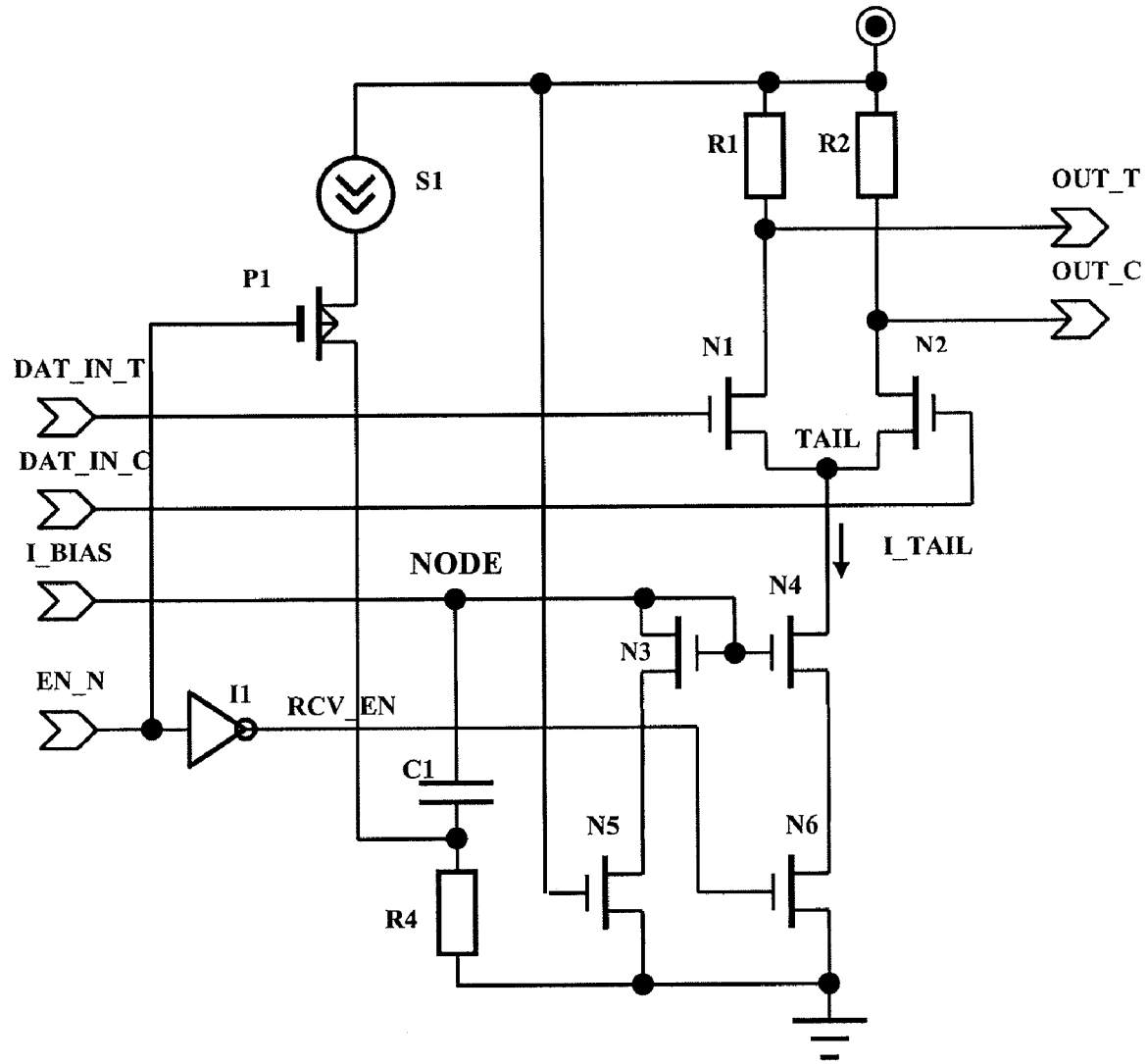
FIG. 8 schematically shows a receiver structure according to a fourth embodiment of the present invention.

FIG. 8 schematically shows a circuit according to a fourth embodiment of the present invention based on the same general concept as discussed above. The embodiment in FIG. 8 has similar components as the configuration discussed with reference to FIGS. 5 and 7, but uses a current source S1 in order to provide the compensation pulse to the node between C1 and N4. The current supply of S1 is triggered by the input signal EN_N via transistor P1.

Hence, a charge compensation pulse is provided to lower or even cancel the charge sharing effect between C1 and N4 so that a compensated tail current I_TAIL as, for example, shown in FIG. 6b by the continuous curve is achieved.

As have been discussed so far, a simple and reliable solution is provided to improve the fast enablement of a differential stage based receiver. Preferably, the compensation pulse generated by the circuits or in the method according to the present invention results in enable times of less than 1 ns, thereby allowing systems and methods to disable the receiver much more frequently, thus achieving substantial power saving.

While the invention has been illustrated and described in detail in the foregoing description, such illustration and description are to be considered illustrative or exemplary and non-restrictive; the invention is thus not limited to the disclosed embodiments. Features mentioned in connection with one embodiment described herein may also be advantageous as features of another embodiment described herein without explicitly showing these features. Variations to the disclosed embodiments can be understood and effected by those skilled in the art and practicing the claimed invention, from a study of the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures can not be used to advantage.

What is claimed is:

1. Circuitry comprising
    a differential stage coupled to receive a data signal;
    a current source configured to supply a current to the differential stage;
    an enabling element coupled to control activation and deactivation of the current source; and
    a compensation circuit configured to provide a compensation pulse to the current source when the current source is activated.

2. Circuitry of claim 1, wherein the compensation circuit comprises a capacitor to provide the compensation pulse.

3. Circuitry of claim 1, wherein the current source comprises a current mirror, and wherein the enabling element is configured to activate or deactivate the current mirror's functionality in response to an enable signal.

4. Circuitry of claim 3, wherein the enabling element comprises an enable transistor, and wherein the enable signal is adapted to render the enable transistor conductive or non-conductive.

5. Circuitry of claim 2, wherein the compensation circuit further comprises a resistor divider circuit, the capacitor being coupled between the current source and the divider bridge.

6. Circuitry of claim 1, wherein the compensation circuit comprises a capacitance divider coupled to the current source (N3, N4).

7. Circuitry of claim 2, wherein the compensation circuit further comprises an additional current source, the capacitor being coupled between the additional current source and the current source.

8. A semiconductor device comprising
    first and second transistors coupled to a common node to function as a differential circuit;
    first and second nodes supplied respectively with a bias voltage and a control signal;
    third and fourth transistors coupled in series between the common node and a reference potential node, the third transistor including a control electrode electrically coupled to the first node, the fourth transistor including a control electrode electrically coupled to the second node; and
    a capacitor electrically coupled between the control electrode of the third transistor and the second node.

9. The device as claimed in claim 8, further comprising a first resistor coupled between the capacitor and the second node and a second resistor coupled between the capacitor and the reference potential node.

10. The device as claimed in claim 9, further comprising a first inverter coupled between the second node and the control electrode of the third transistor and a second inverter coupled between the second node and the first resistor.

11. The device as claimed in claim 8, wherein the capacitor is a first capacitor and the device further comprises a second capacitor coupled between the first node and the reference potential node.

12. The device as claimed in claim 11, further comprising a first inverter coupled between the second node and the control electrode of the third transistor and a second inverter coupled between the second node and the first capacitor.

13. The device as claimed in claim 8, wherein further comprising a switch circuit inserted between the capacitor and the second node and a resistive element coupled between the capacitor and the reference potential node, the switch being rendered conductive when the third transistor rendered conductive.

14. The device as claimed in claim 13, wherein the switch circuit comprises a current source and a fifth transistor including a control electrode coupled to the second node and a source-drain path coupled between the current source and the capacitor.

15. The device as claimed in claim 14, wherein each of the first to fourth transistor is of a first channel type and the fifth transistor is of a second channel type.

16. The device as claimed in claim 14, further comprising an inverter coupled between the second node and the control electrode of the third transistor.

17. A method comprising:
    providing a circuit which comprises first and second transistors functioning as a differential circuit, a third transistor supplied at a control electrode thereof with a bias voltage to function as a current source for the differential circuit, and fourth transistor functioning as a switch for the current source;
    supplying a control signal to the fourth transistor to being the fourth transistor from a non-conductive state to a conductive; and
    boosting a voltage level at a control electrode of the third transistor in response to the third transistor being brought from the non-conductive to the conductive state.

18. The method as claimed in claim 17, wherein the boosting the voltage level comprises charging a capacitor when the third transistor is in the non-conductive state and adding charges of the capacitor to the bias voltage.

19. The method as claimed in claim 18, wherein charging the capacitor comprises supplying one end of the capacitor with a signal related to the control signal and supplying the other end of the capacitor with the bias voltage.

20. The method as claimed in claim 18, wherein charging the capacitor comprises supplying one end of the capacitor with a reference voltage and supplying the other end of the capacitor with the bias voltage when the third transistor is in the non-conductive state.

* * * * *